(12) United States Patent
Cheng et al.

(10) Patent No.: US 10,615,050 B2
(45) Date of Patent: Apr. 7, 2020

(54) METHODS FOR GAPFILL IN HIGH ASPECT RATIO STRUCTURES

(71) Applicant: Applied Materials, Inc., Santa Clara, CA (US)

(72) Inventors: Rui Cheng, Santa Clara, CA (US); Abhijit Basu Mallick, Palo Alto, CA (US); Pramit Manna, Sunnyvale, CA (US); Yihong Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/951,637

(22) Filed: Apr. 12, 2018

(65) Prior Publication Data

US 2019/0172723 A1 Jun. 6, 2019

Related U.S. Application Data

(60) Provisional application No. 62/489,417, filed on Apr. 24, 2017.

(51) Int. Cl.
| | | |
|---|---|---|
| *H01L 21/3213* | (2006.01) | |
| *H01L 21/02* | (2006.01) | |
| *H01L 21/311* | (2006.01) | |
| *H01L 21/768* | (2006.01) | |
| *H01L 29/66* | (2006.01) | |
| *H01L 21/762* | (2006.01) | |

(52) U.S. Cl.
CPC .... *H01L 21/32137* (2013.01); *H01L 21/0262* (2013.01); *H01L 21/02532* (2013.01); *H01L 21/02592* (2013.01); *H01L 21/02667* (2013.01); *H01L 21/31116* (2013.01); *H01L 21/768* (2013.01); *H01L 21/0214* (2013.01); *H01L 21/0217* (2013.01); *H01L 21/02164* (2013.01); *H01L 21/76224* (2013.01); *H01L 29/66545* (2013.01)

(58) Field of Classification Search
None
See application file for complete search history.

(56) References Cited

U.S. PATENT DOCUMENTS

| | | |
|---|---|---|
| 5,242,530 A | 9/1993 | Batey et al. |
| 2006/0003523 A1 | 1/2006 | Haupt |
| 2012/0015518 A1 | 1/2012 | Chandrashekar et al. |
| 2012/0142155 A1 | 6/2012 | Murphy et al. |
| 2013/0260555 A1* | 10/2013 | Zope .................. H01L 21/4846 438/660 |
| 2016/0108515 A1 | 4/2016 | Elghazzali et al. |

(Continued)

FOREIGN PATENT DOCUMENTS

| | | |
|---|---|---|
| CN | 104821277 A | 8/2015 |
| KR | 20110002081 A | 1/2011 |

OTHER PUBLICATIONS

PCT International Search Report and Written Opinion in PCT/US2018/027283 dated Aug. 20, 2018, 13 pages.

*Primary Examiner* — Moazzam Hossain
*Assistant Examiner* — Stanetta D Isaac
(74) *Attorney, Agent, or Firm* — Servilla Whitney LLC

(57) ABSTRACT

Methods for seam-less gapfill comprising depositing a film in a feature, treating the film to change some film property and selectively etching the film from the top surface are described. The deposition, treatment and etching are repeated to form a seam-less gapfill in the feature.

17 Claims, 3 Drawing Sheets

(56) References Cited

U.S. PATENT DOCUMENTS

2017/0053844 A1   2/2017  Tsai et al.
2017/0092508 A1*  3/2017  Tapily ............... H01L 21/30604
2017/0194424 A1*  7/2017  Huang ................ H01L 21/0217
2017/0271196 A1   9/2017  Manna et al.
2018/0033689 A1*  2/2018  Anthis ............. H01L 21/31105

* cited by examiner

METHODS FOR GAPFILL IN HIGH ASPECT RATIO STRUCTURES

CROSS-REFERENCE TO RELATED APPLICATIONS

This application claims priority to U.S. Provisional Application No. 62/489,417, filed Apr. 24, 2017, the entire disclosure of which is hereby incorporated by reference herein.

TECHNICAL FIELD

The present disclosure relates generally to methods of depositing thin films. In particular, the disclosure relates to processes for filling narrow trenches.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. One method that has had past success is flowable CVD. In this method, oligomers are carefully formed in the gas phase which condense on the surface and then "flow" into the trenches. The as-deposited film is of very poor quality and requires processing steps such as steam anneals and UV-cures.

As the dimensions of the structures decrease and the aspect ratios increase post curing methods of the as deposited flowable films become difficult. Resulting in films with varying composition throughout the filled trench.

Amorphous silicon has been widely used in semiconductor fabrication processes as a sacrificial layer since it can provide good etch selectivity with respect to other films (e.g., silicon oxide, amorphous carbon, etc.). With decreasing critical dimensions (CD) in semiconductor fabrication, filling high aspect ratio gaps becomes increasingly sensitive for advanced wafer fabrication. Current metal replacement gate processes involve a furnace poly-silicon or amorphous silicon dummy gate. A seam forms in the middle of the Si dummy gate due to the nature of process. This seam may be opened up during the post process and cause structure failure.

Conventional plasma-enhanced chemical vapor deposition (PECVD) of amorphous silicon (a-Si) forms a "mushroom shape" film on top of the narrow trenches. This is due to the inability of the plasma to penetrate into the deep trenches. The results in pinching-off the narrow trench from the top; forming a void at the bottom of the trench.

Conventional thermal CVD/furnace processes can grow a-Si via thermal decomposition of a silicon precursor (e.g., silane). However, due to the inadequate precursor supply or presence of decomposition byproduct, the deposition rate is higher on top of trenches comparing with it at the bottom. A narrow seam or void can be observed in the trench.

Therefore, there is a need for methods for gapfill in high aspect ratio structures that can provide seam-free film growth.

SUMMARY

One or more embodiments of the disclosure are directed to processing methods comprising providing a substrate surface having at least one feature thereon. The at least one feature extends a depth from the substrate surface to a bottom surface. The at least one feature has a width defined by a first sidewall and a second sidewall. A film is formed on the substrate surface and the first sidewall, second sidewall and bottom surface of the at least one feature. The film has a thickness at the top of the feature and a thickness at the bottom of the feature. The film is treated to change one or more of the structure, composition or morphology of the film to form a treated film. The treated film is etched to remove substantially all of the treated film from the top of the feature and leaving at least some of the treated film at the bottom of the feature.

Additional embodiments of the disclosure are directed to processing methods comprising providing a substrate surface having a feature thereon, the feature having sidewalls and a bottom. A silicon film is deposited in the feature and on the substrate surface. The silicon film is exposed to a treatment to modify a structure, composition or morphology of the silicon film. The treatment comprises exposure to one or more of Ar, He or $H_2$. The film is etched from the substrate surface using one or more of $H_2$, HCl or $Cl_2$ to remove substantially all of the film from the substrate surface and leaving at least some of the film in the feature. The deposition, treatment and etching are repeated to fill the feature.

Further embodiments of the disclosure are directed to processing methods comprising providing a substrate surface having a feature thereon, the feature having sidewalls and a bottom. One or more of SiN, SiO or SiON is formed on the substrate surface so that there is substantially no SiN, SiO or SiON at the bottom of the feature. A substantially amorphous silicon film is deposited in the feature and on the substrate surface. The substantially amorphous silicon film has a thickness in the range of about 1 to about 50 nm. The silicon film is exposed to a treatment to crystallize greater than or equal to about 50% of the amorphous silicon film. The treatment comprises exposure to one or more of Ar, He or $H_2$. The film is etched from the substrate surface using one or more of $H_2$, HCl or $Cl_2$ to remove substantially all of the film from the substrate surface and leaving at least some of the film in the feature. The deposition, treatment etching are repeated to fill the feature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure provide methods of depositing a film (e.g., amorphous silicon) in high aspect ratio (AR) structures with small dimensions. Some embodiments advantageously provide methods involving cyclic deposition-etch-treatment processes that can be performed in a cluster tool environment. Some embodiments advantageously provide seam-free doped or alloyed high quality amorphous silicon films to fill up high AR trenches with small dimensions.

Figure 1:
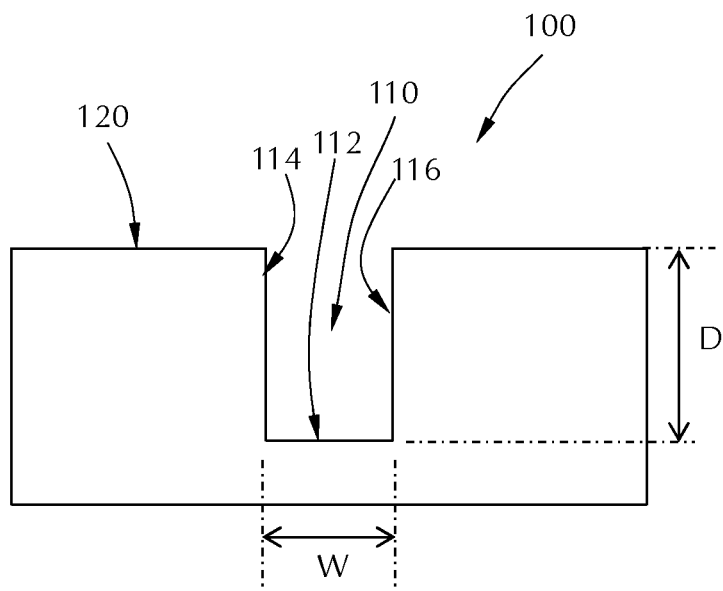
FIG. 1 shows a cross-sectional view of a substrate feature in accordance with one or more embodiment of the disclosure.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

During gapfill processes, it is common for a seam to form in the fill material. The size and width of the seam may affect the overall operability of the gapfill component. The size and width of the seam can also be affected by the process conditions and the material being deposited. One or more embodiments of the disclosure advantageously provide cyclic deposition-treatment-etch process to form a seam-free gapfill. Some embodiments advantageously provide methods of forming seam-free amorphous silicon to fill up high aspect ratio trenches with small dimension.

Without being bound by any particular theory of operation, it is believed that the nucleation of materials (e.g., Si) deposition is different on different surfaces. Therefore, the nucleation on a film with different degrees of crystallinity will be different. Additionally, the etch rate of materials (e.g., Si) will be different on different surfaces. Some embodiments advantageously provide methods that use plasma to etch materials (e.g., Si) faster on top of surface structures than at the bottom of the structures. Some embodiments advantageously use the different etch rates on different surfaces and different locations to create bottom up growth by cycling the deposition-treatment-etch process.

FIGS. 2A through 2E and 3 show an exemplary processing method 200 in accordance with one or more embodiments of the disclosure. A substrate having a feature thereon is provided for processing at 210. As used in this regard, the term "provided" means that the substrate is placed into a position or environment for further processing. In the embodiment illustrated in FIG. 2A, the substrate has two different surfaces; a first surface 150 and a second surface 160. The first surface 150 and the second surface 160 can be different materials. For example, one of the surfaces may be a metal and the other a dielectric. In some embodiments, the first surface and the second surface have the same chemical composition but different physical properties (e.g., crystallinity).

The substrate surface has a feature 110 formed thereon. In the embodiment illustrated in FIG. 2A, the feature 110 is forced by the first surface 150 and the second surface 160. The feature 110 illustrated is a trench in which the first surface 150 forms the bottom of the feature and the second surface 160 form the sidewalls and top.

At 220, a film 170 is formed so that the film forms on the substrate surface (top 174), sidewalls 176 and bottom 172 of the feature 110. In some embodiments, the film 130 forms conformally on at least one feature. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the film 170 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

The film 170 deposited on the substrate will have a film thickness $T_t$ at the top of the feature (i.e., on the surface of the substrate) and a film thickness $T_b$ at the bottom of the feature 110. The film thickness $T_t$ at the top of the feature is generally less than the film thickness $T_b$ at the bottom of the feature. However, the method of depositing the film 170 can affect the top and bottom thicknesses. In some embodiments, the thickness at the top of the feature is greater than the thickness at the bottom of the feature. In some embodiments, the thickness at the bottom of the feature is greater than the thickness at the top of the feature. The thickness at the bottom of the feature may be greater because the film is able to nucleate faster on surface 150 than on surface 160. This results in the film grower faster on the bottom than the sidewalls or top of the feature.

Once the film 170 has begun to form on the sidewalls and top of the feature, there is less of a difference in the differences in the deposition driving force between the bottom and sidewalls/top of the feature. In some embodiments, the film 170 is deposited to a thickness in the range of about 1 to about 50 nm before stopping deposition, or before moving to the treatment process. In some embodiments, the film 170 is deposited to a thickness in the range of about 5 nm to about 40 nm, or in the range of about 10 nm to about 30 nm.

The film 170 can be any suitable film that can be selectively deposited on the first surface 150 relative to the second surface 160. In some embodiments, the film 170 comprises silicon. In some embodiments, the film 170 consists essentially of silicon. As used in this manner, the term "consists essentially of" means that the film is greater than or equal to about 95%, 98% or 99% silicon (or the stated species) on an atomic basis. In some embodiments, the film comprises amorphous silicon. In some embodiments, the film comprises substantially only amorphous silicon. As used in this manner, the term "substantially only amorphous silicon" means that the film is greater than or equal to about 95%, 98% or 99% amorphous silicon.

The film can be formed by an suitable process including, but not limited to, chemical vapor deposition, plasma-enhanced chemical vapor deposition, atomic layer deposition and plasma-enhanced atomic layer deposition. Suitable silicon precursors include, but are not limited to, silane, disilane, dichlorosilane (DCS), trisilane, tetrasilane, etc. The precursor may be heated in a hot can to increase the vapor pressure and be delivered to the chamber using a carrier gas (e.g., ultrahigh purity (UHP) Ar, He, $H_2$, $N_2$, etc.).

The temperature during deposition 220 can be any suitable temperature depending on, for example, the precursor(s) being used. In some embodiments, the deposition temperature is in the range of about 100° C. to 550° C., or in the range of about 150° C. to about 450° C., or in the range of about 200° C. to about 400° C.

The deposition 220 can occur with or without plasma. The plasma can be a conductively-coupled plasma (CCP) or inductively coupled plasma (ICP) and can be a direct plasma or a remote plasma. In some embodiments, the plasma has a power in the range of about 0 to about 2000 W. In some embodiments, the minimum plasma power is greater than 0 W.

The processing chamber pressure during deposition 220 can be in the range of about 100 mTorr to 300 Torr, or in the range of about 200 mTorr to about 250 Torr, or in the range of about 500 mTorr to about 200 Torr, or in the range of about 1 Torr to about 150 Torr.

Figure 2A:
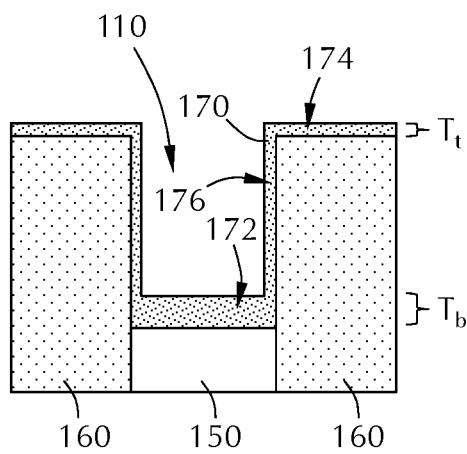
FIGS. 2A through 2E show cross-sectional schematic representations of a gapfill process in accordance with one or more embodiment of the disclosure.
Figure 2B:
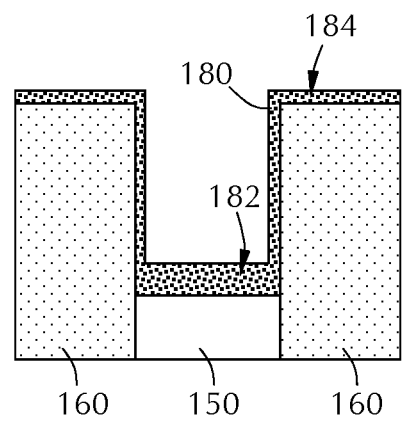
Figure 3:
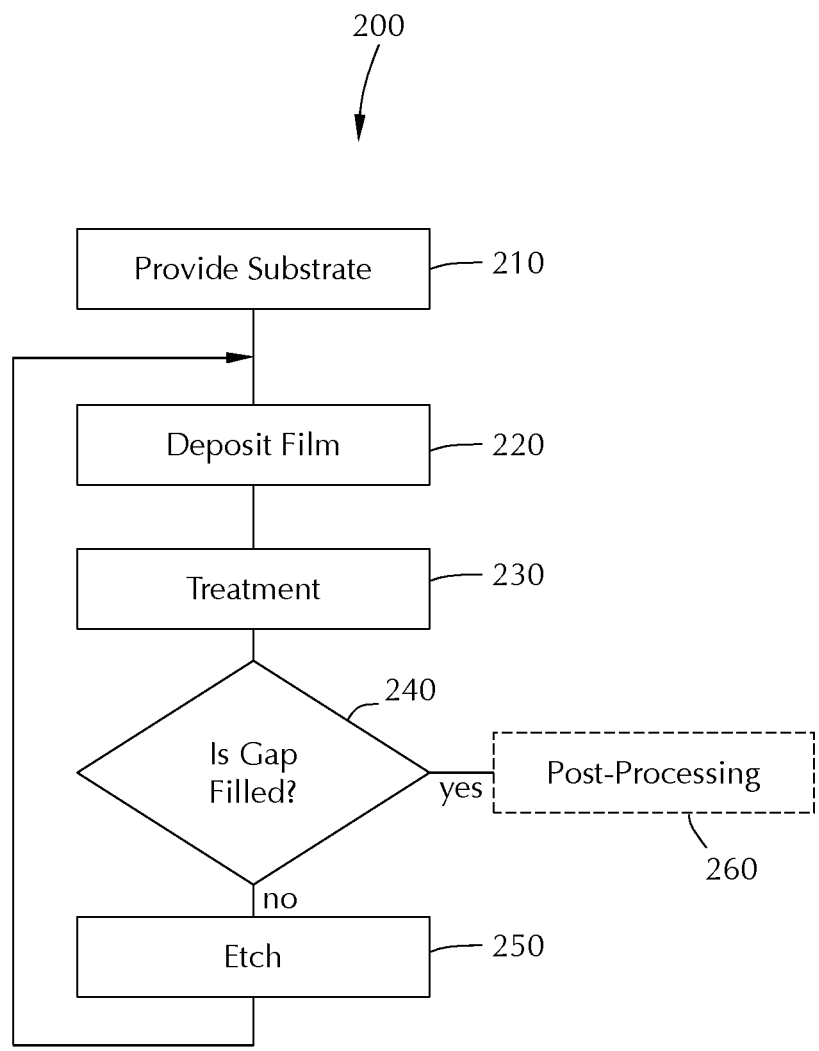
FIG. 3 shows a process flow in accordance with one or more embodiment of the disclosure.

Referring to FIG. 2B and FIG. 3 at 230, once the film 170 has been deposited to a predetermined thickness, the film can be treated. Treating the film 170 causes a change in one or more of the structure, composition or morphology of the film 170 to form a treated film 180.

Treating the film can be accomplished by any suitable process including, but not limited to, chemical exposure with or without plasma, UV, temperature, or other process. In some embodiments, treating the film comprises exposing the film 170 to a plasma comprising one or more of Ar, He or $H_2$.

In some embodiments, the thickness of the treated film 180 at the top 184 is less than the thickness of the treated film 180 at the bottom 182 of the feature. The treatment may cause a change in the thickness of the film. In some embodiments, the treatment causes a change in the crystallinity of the film so that the film is at least partially converted from amorphous to crystalline or from crystalline to amorphous. Stated differently, the treatment of some embodiments crystallizes at least a portion of the film 170. In some embodiments, the film 170 is substantially amorphous silicon and the treated film 180 has an increased crystalline content. In some embodiments, the deposited film comprises substantially only amorphous silicon and the treated film has greater than or equal to about 50%, 60%, 70%, 80%, 90% or 95% crystalline silicon.

In some embodiments, treatment occurs at a pressure in the range of about 100 mTorr to about 300 Torr, or in the range of about 200 mTorr to about 250 Torr, or in the range of about 500 mTorr to about 200 Torr, or in the range of about 1 Torr to about 150 Torr.

In some embodiments, the treatment occurs with plasma exposure that can be either CCP or ICP. In some embodiments, the plasma has a power in the range of about 0 to about 2000 W. In some embodiments, the minimum power is greater than 0 W. The temperature during treatment can be in the range of about 100° C. to 550° C., or in the range of about 150° C. to about 450° C., or in the range of about 200° C. to about 400° C.

Referring to FIG. 3 at 240, a decision point in the flowchart is reached. If the feature or gap has been completely filled, the process can be stopped and the substrate can be subjected to an optional post-processing 260. If the feature or gap has not been filled, the method moves to 250 for an etch process.

Figure 2C:
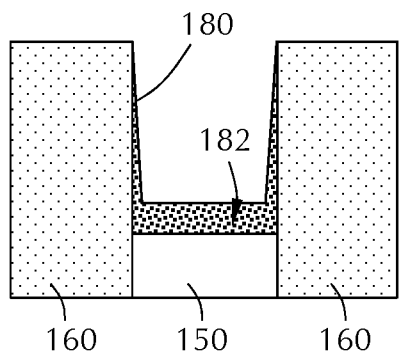

Referring to FIG. 2C, the treated film 180 is subjected to an etch process. Etching the treated film 180 removes substantially all of the treated film from the top 184 leaving at least some of the treated film 180 at the bottom 182 of the feature. As used in this manner, the term "substantially all" means that enough of the treated film 180 on the top 184 has been removed to provide a nucleation delay for a subsequent deposition process. In some embodiments, removing substantially all of the treated film from the top 184 means that at least about 95%, 98% or 99% of the surface area of the second substrate 160 has been etched of the treated film 180. The embodiment illustrated in FIG. 2C shows an amount of treated film 180 on the sidewalls so that the amount increases at greater depth in the feature. This gradient is illustrated as a linear relationship; however, those skilled in the art will understand that this is merely representative.

In some embodiments, etching the treated film 180 comprises exposing the treated film 180 to an etch chemistry comprising one or more of $Cl_2$, $H_2$ or HCl. In some embodiments, the etch chemistry comprises a plasma. The plasma can be a CCP or ICP type plasma. In some embodiments, the etch plasma is a conductively coupled plasma with a power in the range of about 0 W to about 2000 W, or in the range of about 100 W to about 2000 W. In some embodiments, the plasma is an inductively coupled plasma with a power in the range of about 0 W to about 5000 W or in the range of about 100 W to about 5000 W. In some embodiments, the minimum power for the plasma is greater than 0 W.

In some embodiments, etching occurs at a pressure in the range of about 100 mTorr to about 300 Torr, or in the range of about 200 mTorr to about 250 Torr, or in the range of about 500 mTorr to about 200 Torr, or in the range of about 1 Torr to about 150 Torr. The temperature during etching can be in the range of about 100° C. to 550° C., or in the range of about 150° C. to about 450° C., or in the range of about 200° C. to about 400° C.

In some embodiments, the etch rate at the top 184 of the treated film 180 is greater than the etch rate at the bottom 182 of the treated film 180 within the feature. This selective etch can increase the rate at which the feature is filled by removing less of the treated film 180 from the bottom 182.

Figure 2D:
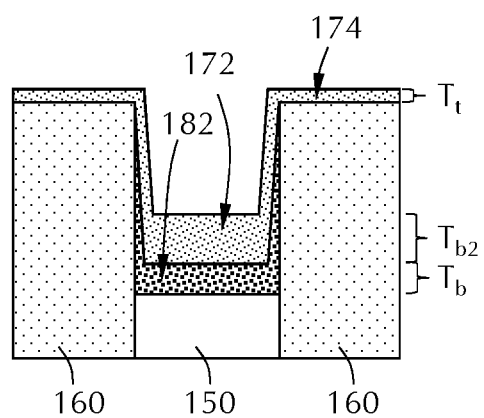
Figure 2E:
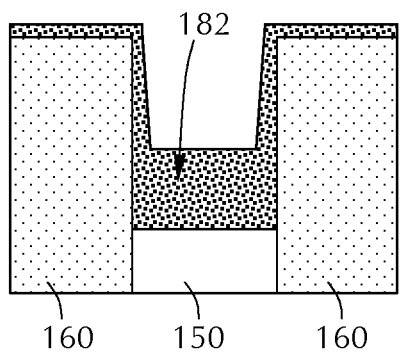

After etching 250, the process flow moves back to the deposition process 220. The deposition process 220 and treatment 230 are repeated and if the feature has not been filled, etching 250 is performed. This process flow continues until the feature is filled. FIG. 2D shows a deposited film 170 on the bottom 172 and top 174 of the feature covering the treated film 180. The thickness $T_{b2}$ of the film at the bottom 172 is greater than the thickness of the film at the top $T_t$ of the feature because the presence of the treated film 180 at the bottom 182 after etching provides a greater deposition rate than at the top of the feature which has no treated film 180 remaining. Additionally, the thickness $T_{b2}$ of the film at the bottom 172 may be greater than the thickness $T_b$ at the bottom 182 of the first cycle of the treated film. This may result from the treated film 180 at the bottom 182 providing faster film growth than the initial first surface 150. FIG. 2E shows the film 170 after treatment to result in the treated film 180 and increasing the overall thickness of the treated film 180. Those skilled in the art will understand that the cycle can continue after FIG. 2E so that the treated film is etched and the deposition and treatment cycles continues until the feature is filled.

In some embodiments, the second surface 160 is modified prior to deposition of the film 170 to increase the selectivity of the deposition. For example, the second surface 160 can be coated with a material that causes a relatively long nucleation delay compared to the bottom of the feature. In some embodiments, one or more of SiN, SiO or SiON is deposited on the substrate surface before forming the film 170. The deposited film can then act as the second surface 160 for selective deposition purposes. In some embodiments, the formation of one or more of SiN, SiO or SiON on the top of the feature results in substantially no SiN, SiO or SiON at the bottom of the feature.

Some embodiments include an optional post-processing 260 process. The post-process 260 can be used to modify the treated film to improve some parameter of the film. In some embodiments, the post-process 260 comprises annealing the film. In some embodiments, post-process 260 can be performed by in-situ anneal in the same process chamber used for deposition 220, treatment 230 and/or etch 250. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of $H_2$, Ar, He, $N_2$, $NH_3$, $SiH_4$, etc. The pressure during the anneal can be in the range of about 100 mTorr to about 1 atm.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
   forming a film on substrate surface, and a first sidewall, a second sidewall and a bottom surface of at least one feature extending a depth from the substrate surface to the bottom surface, the feature having a width defined by the first sidewall and second sidewall, the film having a thickness at a top of the feature and a thickness at the bottom of the feature;
   treating the film to change one or more of structure, composition or morphology of the film to form a treated film having a greater etch rate at the substrate surface than at the bottom surface; and
   etching the treated film by exposing the treated film to an etch chemistry comprising a plasma of one or more of $Cl_2$, $H_2$ or HCl to remove substantially all of the treated film from the top of the feature and leaving at least some of the treated film at the bottom of the feature.

2. The method of claim 1, further comprising repeating forming the film, treating the film, and if the feature is not full, etching the treated film until the feature is full.

3. The method of claim 1, wherein treating the film comprises exposing the film to a plasma comprising one or more of Ar, He or $H_2$.

4. The method of claim 3, wherein the film is substantially amorphous and treating the film crystallizes at least a portion of the film.

5. The method of claim 1, wherein the film comprises silicon.

6. The method of claim 1, wherein the film is deposited to a thickness in the range of about 1 to about 50 nm before treating.

7. The method of claim 1, wherein the plasma is a conductively coupled plasma with a power in the range of about 100 W to about 2000 W.

8. The method of claim 1, wherein the plasma is an inductively coupled plasma with a power in the range of about 100 W to about 5000 W.

9. The method of claim 1, wherein the substrate comprises silicon.

10. The method of claim 9, further comprising depositing one or more of SiN, SiO or SiON on the substrate surface before forming the film so that there is substantially no SiN, SiO or SiON at the bottom of the feature.

11. A processing method comprising:
    depositing a silicon film in a feature on a substrate surface, the feature having sidewalls and a bottom;
    exposing the silicon film to a treatment to modify a structure, composition or morphology of the silicon film to have a greater etch rate at the substrate surface than at the bottom, the treatment comprising exposure to one or more of Ar, He or $H_2$;
    etching the film from the substrate surface using a plasma comprising one or more of $H_2$, HCl or $Cl_2$ to remove substantially all of the film from the substrate surface and leaving at least some of the film in the feature; and
    repeating the deposition, treatment and etching to fill the feature.

12. The method of claim 11, wherein the silicon film is substantially amorphous and exposure to the treatment crystallizes at least a portion of the film.

13. The method of claim 12, wherein greater than or equal to about 50% of the silicon film is crystallized after exposing the silicon film to the treatment.

14. The method of claim 11, wherein the silicon film is deposited to a thickness in the range of about 1 to about 50 nm before treating.

15. The method of claim 11, wherein the plasma is a conductively coupled plasma with a power in the range of about 100 W to about 2000 W or an inductively coupled plasma with a power in the range of about 100 W to about 5000 W.

16. The method of claim 11, further comprising forming one or more of SiN, SiO or SiON on the substrate surface before forming the film so that there is substantially no SiN, SiO or SiON at the bottom of the feature.

17. A processing method comprising:
    providing a substrate surface having a feature thereon, the feature having sidewalls and a bottom;
    forming one or more of SiN, SiO or SiON on the substrate surface so that there is substantially no SiN, SiO or SiON at the bottom of the feature;
    depositing a substantially amorphous silicon film in the feature and on the substrate surface, the substantially amorphous silicon film having a thickness in the range of about 1 to about 50 nm;
    exposing the silicon film to a treatment to crystallize greater than or equal to about 50% of the amorphous silicon film, the treatment comprising exposure to one or more of Ar, He or $H_2$;
    etching the film from the substrate surface using one or more of $H_2$, HCl or $Cl_2$ to remove substantially all of the film from the substrate surface and leaving at least some of the film in the feature; and
    repeating the deposition, treatment and etching to fill the feature.

* * * * *

UNITED STATES PATENT AND TRADEMARK OFFICE
CERTIFICATE OF CORRECTION

PATENT NO.         : 10,615,050 B2
APPLICATION NO.    : 15/951637
DATED              : April 7, 2020
INVENTOR(S)        : Rui Cheng et al.

Page 1 of 1

It is certified that error appears in the above-identified patent and that said Letters Patent is hereby corrected as shown below:

In Column 9, Claim 1, Line 36, insert --a-- after "on" and before "substrate".

Signed and Sealed this
Ninth Day of June, 2020

Andrei Iancu
*Director of the United States Patent and Trademark Office*